(12) United States Patent
Nasu et al.

(10) Patent No.: US 10,777,599 B2
(45) Date of Patent: Sep. 15, 2020

(54) SOLID STATE IMAGING DEVICE

(71) Applicants: Kabushiki Kaisha Toshiba, Tokyo (JP); Toshiba Electronic Devices & Storage Corporation, Tokyo (JP)

(72) Inventors: Hayato Nasu, Tokyo (JP); Yasushi Itabashi, Tokyo (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 16/274,711

(22) Filed: Feb. 13, 2019

(65) Prior Publication Data

US 2020/0091216 A1 Mar. 19, 2020

(30) Foreign Application Priority Data

Sep. 18, 2018 (JP) .................................. 2018-173795

(51) Int. Cl.
*H01L 27/146* (2006.01)
*H01L 23/532* (2006.01)

(52) U.S. Cl.
CPC .. *H01L 27/14636* (2013.01); *H01L 23/53214* (2013.01); *H01L 23/53266* (2013.01)

(58) Field of Classification Search
CPC ......... H01L 27/14636; H01L 23/53214; H01L 23/53266
See application file for complete search history.

(56) References Cited

U.S. PATENT DOCUMENTS

| 7,439,623 | B2 | 10/2008 | Harada | |
|---|---|---|---|---|
| 7,999,361 | B1* | 8/2011 | Chen | H01L 23/5225 257/659 |
| 8,039,968 | B2* | 10/2011 | Kondou | H01L 23/522 257/410 |
| 2005/0167842 | A1* | 8/2005 | Nakamura | H01L 23/522 257/758 |
| 2005/0179134 | A1* | 8/2005 | Matsubara | H01L 23/5226 257/758 |
| 2013/0009321 | A1* | 1/2013 | Kagawa | H01L 23/53266 257/774 |

FOREIGN PATENT DOCUMENTS

| JP | H8-222721 A | 8/1996 |
|---|---|---|
| JP | 2005-175196 A | 6/2005 |
| JP | 4047324 B2 | 2/2008 |
| JP | 2008-218755 A | 9/2008 |
| JP | 2016-129161 A | 7/2016 |

* cited by examiner

*Primary Examiner* — Karen Kusumakar
(74) *Attorney, Agent, or Firm* — White & Case LLP

(57) ABSTRACT

According to one embodiment, the interconnect layers include a first interconnect layer and a second interconnect layer. The second interconnect layer is provided on the first interconnect layer. The insulating layer is provided between the plurality of interconnect layers. The barrier metal film is provided at a surface of the first interconnect layer but not provided at a surface of the second interconnect layer. The plugs connect the first interconnect layer and the second interconnect layer, and are provided between the first interconnect layer and the second interconnect layer. The plugs are arranged at a spacing of 200 µm or less along a longitudinal direction of the second interconnect layer.

12 Claims, 4 Drawing Sheets

SOLID STATE IMAGING DEVICE

CROSS-REFERENCE TO RELATED APPLICATION

This application is based upon and claims the benefit of priority from Japanese Patent Application No. 2018-173795, filed on Sep. 18, 2018; the entire contents of which are incorporated herein by reference.

FIELD

Embodiments described herein relate generally to a solid state imaging device.

BACKGROUND

A structure of a solid state imaging device has been proposed in which a barrier metal is not provided on an interconnect to suppress dark current.

DETAILED DESCRIPTION

Figure 1A:
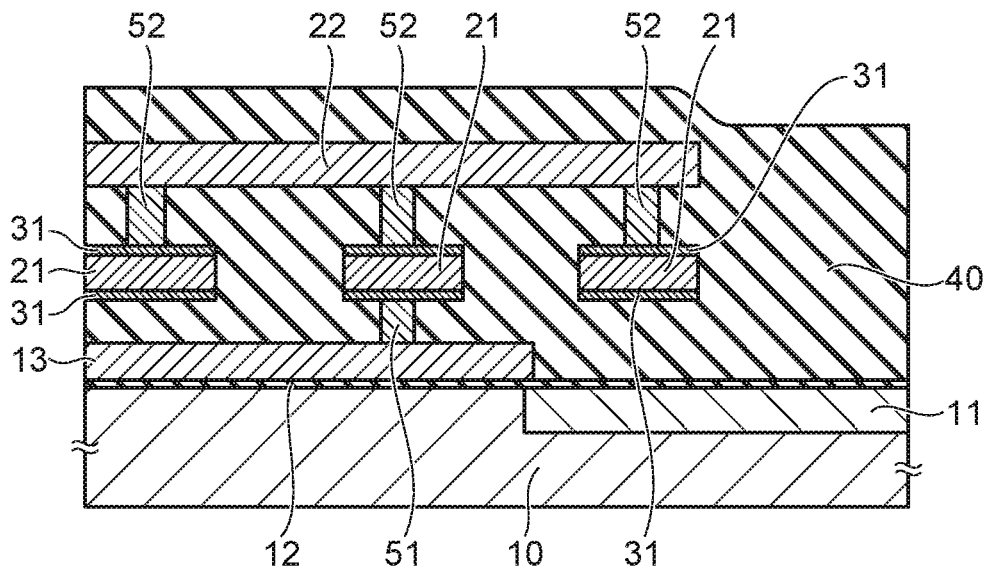
FIG. 1A is a schematic cross-sectional view of a solid state imaging device of an embodiment.

According to an embodiment, a solid state imaging device includes a substrate, a pixel, a plurality of interconnect layers, an insulating layer, a barrier metal film, and a plurality of plugs. The pixel is provided at a surface of the substrate. The interconnect layers are provided on the substrate. The interconnect layers include a first interconnect layer and a second interconnect layer. The second interconnect layer is provided on the first interconnect layer. The insulating layer is provided between the plurality of interconnect layers. The barrier metal film is provided at a surface of the first interconnect layer but not provided at a surface of the second interconnect layer. The plugs connect the first interconnect layer and the second interconnect layer, and are provided between the first interconnect layer and the second interconnect layer. The plugs are arranged at a spacing of 200 μm or less along a longitudinal direction of the second interconnect layer.

Embodiments will now be described with reference to the drawings. The same components in the drawings are marked with the same reference numerals.

Figure 1B:
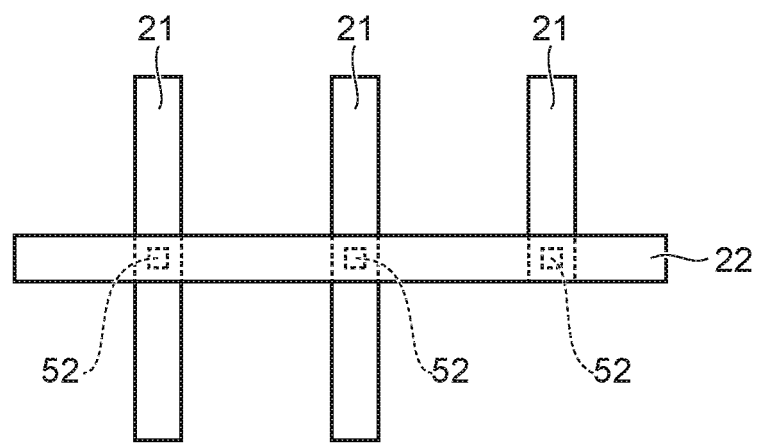
FIG. 1B is a schematic plan view of interconnect layers of the solid state imaging device of the embodiment.

FIG. 1A is a schematic cross-sectional view of a solid state imaging device of an embodiment; and FIG. 1B is a schematic plan view of interconnect layers of the solid state imaging device of the embodiment.

The solid state imaging device of the embodiment includes a substrate 10, a pixel 11 provided at the surface of the substrate 10, multiple interconnect layers 21 and 22, multiple plugs 51 and 52, and an insulating layer 40. The multiple interconnect layers 21 and 22, the multiple plugs 51 and 52, and the insulating layer 40 are provided on the substrate 10.

The pixel 11 includes a photoelectric converter. The substrate 10 is, for example, a silicon substrate. The pixel 11 includes, for example, a P-N junction between N-type silicon and P-type silicon. The solid state imaging device of the embodiment is, for example, a linear sensor and includes a pixel column in which the multiple pixels 11 are arranged in one direction.

An insulating film 12 is provided at the surface of the substrate 10. The insulating film 12 is, for example, a silicon oxide film. A gate electrode 13 for charge transfer is provided on the insulating film 12 in a region proximal to the pixel 11.

The interconnect layer 21 is provided in a layer higher than the gate electrode 13. The interconnect layer 21 includes an interconnect layer electrically connected to the gate electrode 13 via the plug 51. The plug 51 is provided between the gate electrode 13 and the interconnect layer 21.

The interconnect layer 22 is provided in a layer higher than the interconnect layer 21. In the example shown in FIG. 1B, the interconnect layer 21 and the interconnect layer 22 cross each other in planes parallel to the surface of the substrate 10.

The multiple plugs 52 are provided between the interconnect layer 21 and the interconnect layer 22. The plugs 52 electrically connect the interconnect layer 21 and the interconnect layer 22.

A barrier metal film 31 is provided at the surfaces (the upper surface and the lower surface) of the interconnect layer 21. A barrier metal film is not provided at the surface of the interconnect layer 22.

The insulating layer 40 is provided between the gate electrode 13 and the interconnect layer 21, between the interconnect layer 21 and the interconnect layer 22, and on the interconnect layer 22. Also, the insulating layer 40 is provided at the periphery of the plugs 51 and 52. The insulating layer 40 covers the gate electrode 13, the interconnect layers 21 and 22, the barrier metal film 31, and the plugs 51 and 52.

The interconnect layers 21 and 22 are metal layers including aluminum as a major component. The interconnect layers 21 and 22 are, for example, aluminum layers, copper-including aluminum layers, or aluminum layers including copper and silicon.

The plugs 51 and 52 are metal members having columnar configurations and include, for example, tungsten.

The barrier metal film 31 is a metal film of a material different from the interconnect layers 21 and 22 and includes, for example, titanium. The barrier metal film 31 is, for example, a titanium film or a titanium nitride film, Or, the barrier metal film 31 is a stacked film of a titanium film and a titanium nitride film. Or, the barrier metal film 31 is a stacked film of a tantalum film, a tantalum nitride film, a tantalum film, and a tantalum nitride film.

The insulating layer 40 is, for example, a silicon oxide film. For example, the insulating layer 40 is formed by CVD (Chemical Vapor Deposition). The insulating layer 40 includes hydrogen due to the source gas of the formation.

When electrons are trapped by dangling bonds of silicon atoms at the surface of the substrate 10, the electrons flow as dark current in the charge transfer operation and may cause degradation of the dark characteristics of the solid state imaging device.

According to the embodiment, the hydrogen that is included inside the insulating layer 40 diffuses into the surface of the substrate 10 in a subsequent heating process; and the surface of the substrate 10 can be terminated by the hydrogen. This suppresses the dangling bonds of the silicon at the surface of the substrate 10. Accordingly, the trapping of the electrons by the dangling bonds of the substrate 10 can be suppressed; and the dark characteristics can be improved.

In particular, the barrier metal film 31 that includes titanium has good adhesion to hydrogen and can obstruct the supply of the hydrogen to the substrate 10. Therefore, according to the embodiment, the barrier metal film 31 is not provided at all of the interconnect layers; the interconnect layer 22 without the barrier metal is provided; thereby, the amount of the barrier metal obstructing the supply of the hydrogen to the substrate 10 is reduced. In the example shown in FIG. 1A, the barrier metal film is not provided at the interconnect layer 22 of the uppermost layer.

Figure 4:
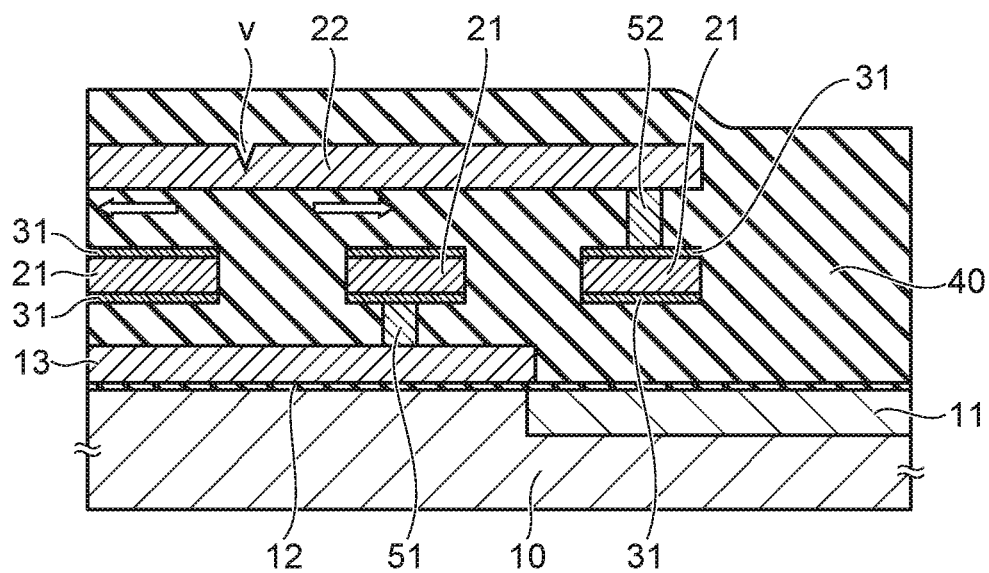
FIG. 4 is a schematic cross-sectional view of a solid state imaging device of a comparative example.

For example, the manufacturing processes of the solid state imaging device include a heat treatment process at about 400° C. The heat treatment process generates tensile stress in the insulating layer 40; and the insulating layer 40 applies stress to the interconnect layers. In particular, in the interconnect layer 22 where the barrier metal film is not provided, as in a comparative example shown in FIG. 4, a void v occurs easily due to the tensile stress from the insulating layer 40. The void v may cause electrical disconnects and/or a resistance increase of the interconnect layers.

Conversely, according to the embodiment as shown in FIGS. 1A and 1B, the multiple plugs 52 are provided between the interconnect layer 22 without the barrier metal film and the interconnect layer 21 under the interconnect layer 22 to connect the interconnect layer 22 and the interconnect layer 21. To electrically connect the interconnect layer 22 and the interconnect layer 21, it is sufficient for at least one plug 52 to connect the interconnect layer 22 and the interconnect layer 21. However, according to the embodiment, to increase the strength against stress of the interconnect layer 22 where the barrier metal film is not provided, the multiple plugs 52 are arranged along the longitudinal direction of the interconnect layer 22.

The insulating layer 40 that contacts the lower surface of the interconnect layer 22 is divided into multiple regions along the longitudinal direction of the interconnect layer 22 by the multiple plugs 52. The plugs 52 can function as stoppers that stop the movement of the insulating layer 40 pulled along the longitudinal direction of the interconnect layer 22. Thereby, the stress on the interconnect layer 22 from the insulating layer 40 can be reduced; and the occurrence of voids can be suppressed.

According to an experiment, it was confirmed that the occurrence of voids can be suppressed by arranging the multiple plugs 52 at a spacing of 200 μm or less along the longitudinal direction of the interconnect layer 22. Accordingly, it is desirable for the arrangement pitch of the multiple plugs 52 to be 200 μm or less.

Figure 2:
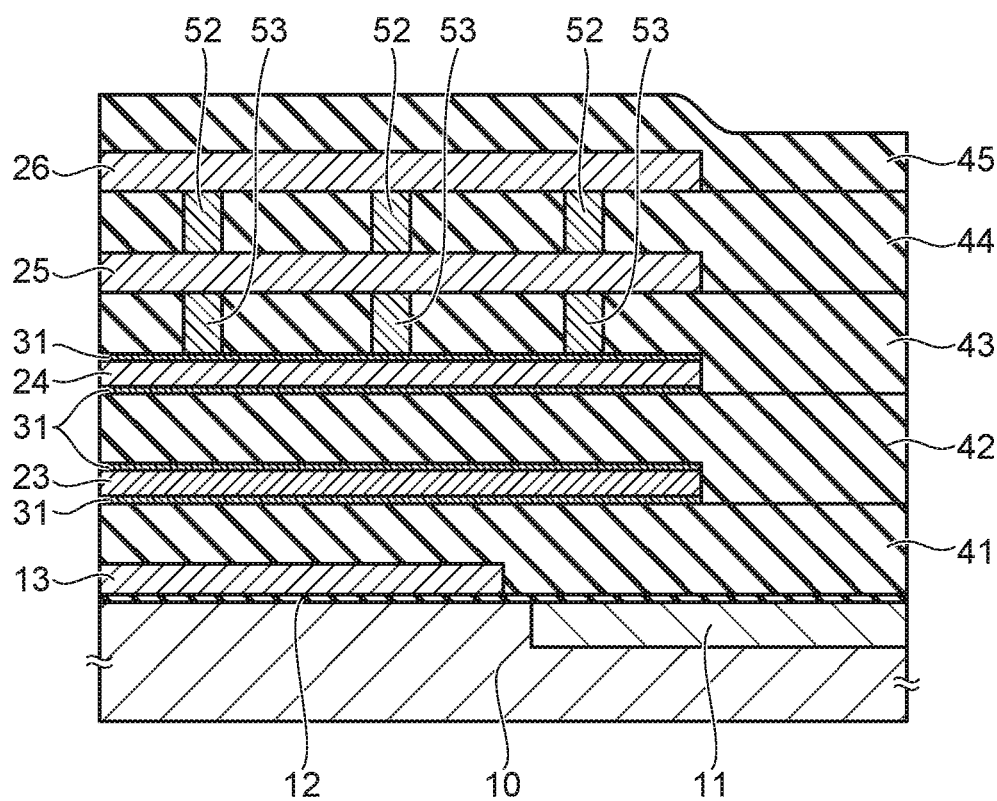
FIG. 2 is a schematic cross-sectional view of another example of the solid state imaging device of the embodiment.

FIG. 2 is a schematic cross-sectional view of another example of the solid state imaging device of the embodiment. The same components as those of the embodiment recited above are marked with the same reference numerals; and a description is omitted.

Multiple interconnect layers 23 to 26 are provided on the substrate 10. The interconnect layer 24 is provided in a layer higher than the interconnect layer 23; the interconnect layer 25 is provided in a layer higher than the interconnect layer 24; and the interconnect layer 26 is provided in a layer higher than the interconnect layer 25.

An insulating layer 41 is provided between the substrate 10 and the interconnect layer 23. The insulating layer 41 covers the gate electrode 13. An insulating layer 42 is provided between the interconnect layer 23 and the interconnect layer 24. An insulating layer 43 is provided between the interconnect layer 24 and the interconnect layer 25. An insulating layer 44 is provided between the interconnect layer 25 and the interconnect layer 26. An insulating layer 45 is provided on the interconnect layer 26.

Multiple plugs 53 are provided between the interconnect layer 25 and the interconnect layer 24. The plugs 53 electrically connect the interconnect layer 25 and the interconnect layer 24. The multiple plugs 52 are provided between the interconnect layer 26 and the interconnect layer 25. The plugs 52 electrically connect the interconnect layer 26 and the interconnect layer 25.

The barrier metal film 31 is provided at the surfaces (the upper surface and the lower surface) of the interconnect layers 23 and 24. The barrier metal film is not provided at the surfaces of the interconnect layers 25 and 26.

The interconnect layers 23 to 26 are metal layers including aluminum as a major component and are, for example, aluminum layers, copper-including aluminum layers, or aluminum layers including copper and silicon. The plugs 52 and 53 are metal members having columnar configurations and include, for example, tungsten.

The insulating layers 41 to 45 are, for example, silicon oxide films. For example, the insulating layers 41 to 45 are formed by CVD. The insulating layers 41 to 45 include hydrogen due to the source gas of the formation.

In the example shown in FIG. 2 as well, the barrier metal film 31 is not provided at all of the interconnect layers; the interconnect layers 25 and 26 without the barrier metal are provided; thereby, the amount of the barrier metal obstructing the supply of the hydrogen to the substrate 10 is reduced.

The multiple plugs 53 are provided between the interconnect layer 25 and the interconnect layer 24; and the multiple plugs 52 are provided between the interconnect layer 26 and the interconnect layer 25. In other words, the multiple plugs 53 are arranged along the longitudinal direction of the interconnect layer 25 to increase strength against the stress of the interconnect layer 25 at which the barrier metal film is not provided; and the multiple plugs 52 are arranged along the longitudinal direction of the interconnect layer 26 to increase strength against the stress of the interconnect layer 26 at which the barrier metal film is not provided.

The insulating layer 43 that contacts the lower surface of the interconnect layer 25 is divided into multiple regions along the longitudinal direction of the interconnect layer 25 by the multiple plugs 53. The insulating layer 44 that contacts the upper surface of the interconnect layer 25 and the lower surface of the interconnect layer 26 is divided into multiple regions along the longitudinal direction of the interconnect layers 25 and 26 by the multiple plugs 52.

The plugs 52 and 53 can function as stoppers that stop the movement of the insulating layers 43 and 44 pulled along the longitudinal directions of the interconnect layers 25 and 26. Thereby, the stress on the interconnect layers 25 and 26 from the insulating layers 43 and 44 can be reduced; and the occurrence of voids can be suppressed. In particular, the stress on the interconnect layer 25 from the insulating layer 43 under the interconnect layer 25 and the stress on the interconnect layer 25 from the insulating layer 44 on the interconnect layer 25 both can be reduced; and the occurrence of voids can be suppressed effectively.

In the example shown in FIG. 2 as well, based on the experimental results recited above, it is desirable for the multiple plugs 52 and 53 to be arranged at a spacing of 200 µm or less along the longitudinal directions of the interconnect layers 25 and 26.

Figure 3A:
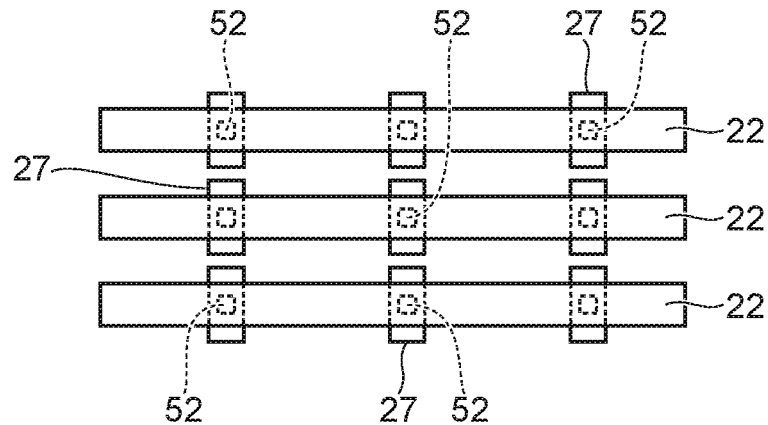
FIGS. 3A to 3C are schematic plan views of other examples of the interconnect layers of the solid state imaging device of the embodiment.
Figure 3B:
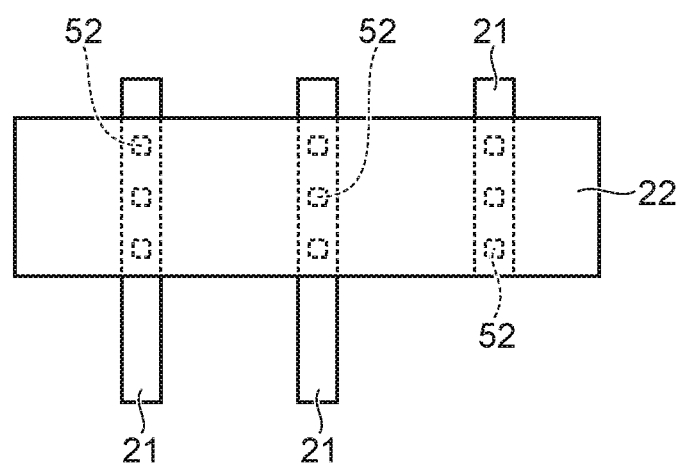
Figure 3C:
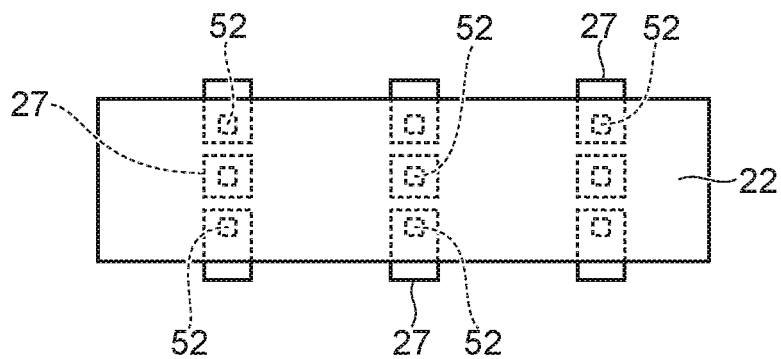

FIGS. 3A to 3C are schematic plan views of other examples of the interconnect layers of the solid state imaging device of the embodiment.

In the example shown in FIG. 3A, multiple metal layers 27 are arranged under the interconnect layer 22 where the barrier metal film is not provided. The multiple metal layers 27 are arranged along the longitudinal direction of the interconnect layer 22.

The plugs 52 are provided between the interconnect layer 22 and the metal layers 27. The plugs 52 connect the interconnect layer 22 and the metal layers 27.

An insulating layer that contacts the lower surface of the interconnect layer 22 is divided into multiple regions along the longitudinal direction of the interconnect layer 22 by the multiple plugs 52. The plugs 52 can function as stoppers that stop the movement of the insulating layer pulled along the longitudinal direction of the interconnect layer 22. Thereby, the stress on the interconnect layer 22 from the insulating layer can be reduced; and the occurrence of voids can be suppressed.

The metal layers 27 are dummy interconnect layers that do not perform signal transfer, and are provided as isolated patterns having island configurations inside the insulating layer. In other words, the multiple metal layers 27 are provided to reduce the stress and are provided as support bodies that support the multiple plugs 52.

In the example shown in FIG. 3B, the multiple interconnect layers 21 that extend in a direction crossing the longitudinal direction of the interconnect layer 22 are provided under the interconnect layer 22 where the barrier metal film is not provided. The multiple plugs 52 are arranged along the longitudinal directions of the interconnect layers 21 between the interconnect layer 22 and each of the interconnect layers 21.

In the example shown in FIG. 3C, the metal layers (the dummy interconnect layers) 27 that have multiple island configurations are provided under one interconnect layer 22 where the barrier metal film is not provided. The multiple plugs 52 are provided between the one interconnect layer 22 and the multiple metal layers 27.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A solid state imaging device, comprising:
a substrate;
a pixel provided at a surface of the substrate;
a plurality of interconnect layers provided on the substrate, the plurality of interconnect layers including a first interconnect layer and a second interconnect layer, the second interconnect layer being provided on the first interconnect layer and extending in a first direction;
an insulating layer provided between the plurality of interconnect layers;
a barrier metal film provided at a surface of the first interconnect layer but not provided at a surface of the second interconnect layer; and
three or more plugs connecting the first interconnect layer and the second interconnect layer, and being provided between the first interconnect layer and the second interconnect layer,
the three or more plugs being arranged at a spacing of 200 µm or less along the first direction within a range where the second interconnect layer is continuous.

2. The device according to claim 1, wherein
the interconnect layers include a third interconnect layer provided on the second interconnect layer and extending in the first direction,
the barrier metal film is not provided at a surface of the third interconnect layer, and
the three or more plugs connect the second interconnect layer and the third interconnect layer, and are provided also between the second interconnect layer and the third interconnect layer at a spacing of 200 µm or less, and the three or more plugs being arranged along the first direction within a range where the second interconnect layer and the third interconnect layer are continuous.

3. The device according to claim 1, wherein the interconnect layers include aluminum.

4. The device according to claim 1, wherein the barrier metal film includes titanium.

5. The device according to claim 1, wherein the barrier metal film includes tantalum.

6. The device according to claim 1, wherein the plugs include tungsten.

7. The device according to claim 1, wherein the insulating layer includes hydrogen.

8. A solid state imaging device, comprising:
a substrate;
a pixel provided at a surface of the substrate;
at least one layer of an interconnect layer provided on the substrate and extending in a first direction, a barrier metal film not being provided at a surface of the interconnect layer;
three or more metal layers provided under the interconnect layer, the three or more metal layers being arranged along the first direction within a range where the interconnect layer is continuous;
an insulating layer provided between the interconnect layer and the metal layers; and
three or more plugs connecting the interconnect layer and the metal layers, and being provided between the interconnect layer and the metal layers, the three or more plugs being arranged along the first direction within the rage where the interconnect layer is continuous,
the metal layers being provided in island configurations inside the insulating layer.

9. The device according to claim 8, wherein the plugs are arranged at a spacing of 200 µm or less along the first direction of the interconnect layer.

10. The device according to claim 8, wherein the interconnect layer includes aluminum.

11. The device according to claim 8, wherein the plugs include tungsten.

12. The device according to claim 8, wherein the insulating layer includes hydrogen.

* * * * *